United States Patent [19]

Nashimoto

[11] Patent Number: 5,650,362
[45] Date of Patent: Jul. 22, 1997

[54] ORIENTED CONDUCTIVE FILM AND PROCESS FOR PREPARING THE SAME

[75] Inventor: Keiichi Nashimoto, Minami Ashigara, Japan

[73] Assignee: Fuji Xerox Co., Toyko, Japan

[21] Appl. No.: 439,371

[22] Filed: May 11, 1995

Related U.S. Application Data

[62] Division of Ser. No. 325,583, Oct. 19, 1994, abandoned.

[30] Foreign Application Priority Data

Nov. 4, 1993 [JP] Japan ................ 5-297620
Nov. 4, 1993 [JP] Japan ................ 5-297621
Nov. 4, 1993 [JP] Japan ................ 5-297622

[51] Int. Cl.$^6$ ............................................ H01L 21/02
[52] U.S. Cl. .............. 437/243; 427/100; 427/126.3; 427/376.2; 427/419.3
[58] Field of Search .................. 427/100, 126.3, 427/376.2, 419.3; 437/243

[56] References Cited

U.S. PATENT DOCUMENTS

| | | | |
|---|---|---|---|
| 4,419,533 | 12/1983 | Czubatyj et al. | 136/259 |
| 4,647,895 | 3/1987 | Howng | 338/22 R |
| 4,761,711 | 8/1988 | Hiremath et al. | 361/321 |
| 5,084,438 | 1/1992 | Matsubara et al. | 505/1 |
| 5,179,070 | 1/1993 | Harada et al. | 505/1 |
| 5,361,720 | 11/1994 | Evetts et al. | 505/329 |

FOREIGN PATENT DOCUMENTS 61-225711 10/1986 Japan.
4-182393 6/1992 Japan.

OTHER PUBLICATIONS

"Epitaxial LiNbO$_3$ Thin Films Prepared By a Sol–Gel Process," *Material Letters*, vol. 10, No. 7,8, (1991), pp. 348–354.

Blum et al., "Sol–gel derived PbTiO$_3$," Journal of Material Science vol. 20 (1985) pp. 4479–4483.

Yi et al., "Sol–gel Processing of Complex Oxide Films" Ceramic Bulletin vol. 7 No. 7 (1991) pp. 1173–1179.

Lee et al., "Effects of Crystalline Quality and Electrode Material on Fatigue in Pb(Zr,Ti)O$_3$ Thin Film Capacitors," Appl. Phys. Lett. 63(1) (1993) pp. 27–29.

Primary Examiner—Benjamin Utech
Attorney, Agent, or Firm—Oliff & Berridge

[57] ABSTRACT

An oriented conductive thin film useful as a thin film electrode or a thin film resistor may be made by coating a single crystal substrate with a metal oxide precursor solution containing an organometallic compound, and subjecting the coating layer to thermal decomposition, followed by annealing the coated substrate. The result is an epitaxial or oriented perovskite ABO$_3$ structure oxide conductive thin film. A further layer of an epitaxial or oriented ABO$_3$ type ferroelectric thin film can be formed on the conductive thin film.

16 Claims, 6 Drawing Sheets

ORIENTED CONDUCTIVE FILM AND PROCESS FOR PREPARING THE SAME

This is a division of application Ser. No. 08/325,583 filed Oct. 19, 1994, now abandoned.

FIELD OF THE INVENTION

This invention relates to an oriented conductive thin film suitable for an electrode or a resistor to be used in electronic devices (elements), such as a nonvolatile memory, a capacitor, and a light modulation device.

BACKGROUND OF THE INVENTION

A thin film electrode or a thin film heating resistor to be used in various electronic components has conventionally been obtained by vapor phase deposition, such as electron beam deposition and sputtering. On the other hand, a method using organometallic compound (metal oxide deposition (MOD)) or a paste method has mainly been used for preparation of a relatively thick conductive film as an electrode or a heating resistor. The former techniques involve such problems as expensiveness of equipment and difficulties in controlling the film composition and in obtaining a large-area film, while the latter techniques have problems of film properties and film thickness.

In the paste method, which is advantageous in initial cost, control of film composition, and ease of obtaining a large-area film, a paste composition comprising a noble metal powder, e.g., Pd, Ag, Pd—Ag or Pt, as a conducting material, a binder, a solvent, glass frit, etc. is applied to a substrate and baked to form a thick film of the noble metal. However, a noble metal, though resistant to oxidation, is very expensive. It has been proposed to form a film of conductive oxide, such as $BaPbO_3$, by a paste method as disclosed in JP-A-61-225711 (the term "JP-A" as used herein means an unexamined published Japanese patent application), but, as stated above, an oxide film prepared by a paste method is unsuitable for electronic devices (elements) requiring a thin film.

A nonvolatile memory using a thin film of a ferroelectric substance involves fatigue of the ferroelectric substance with switching by metal electrodes, such as Pt. In recent years, it has become known that an oxide electrode suppresses fatigue of a ferroelectric thin film with switching. For example, J. Lee, et al., *Appl. Phys. Lett.*, vol. 63, p. 27 (1993) reported the inhibitory effect of $YBa_2Cu_3O_x$ on switching fatigue of $Pb(Zr_{0.52}Ti_{0.48})$ However, it is not easy to prepare a thin film of such a superconducting material as $YBa_2CU_3O_x$ in controlling the oxygen concentration.

As reported in K. Nashtmoto, et al., *Mater. Lett.*, Vol. 10, (7, 8), p. 348 (1991), the present inventors found that a single crystal of $LiNbO_3$ epitaxially grows on a sapphire single crystal ($Al_2O_3$) as a substrate to form a ferroelectric thin film if the starting organometallic compounds, $LiOC_2H_5$ and $Nb(OC_2H_5)_5$, are used without being hydrolyzed beforehand. In some detail, with addition of water to an ethanol solution of a ferroelectric substance precursor, i.e., $Li[Nb(OC_2H_5)_6]$, the oriented $LiNbO_3$ film turns polycrystalline film on baking. If the precursor is baked with no water content, the $LiNbO_3$ thin film shows epitaxial growth at a temperature as low as 400° C. However, this method has never succeeded in obtaining an epitaxial or oriented film of a conductive oxide.

Further, the present inventors previously obtained a structure in which extremely chemically stable MgO is made to grow by epitaxy on a semiconductor substrate to form a buffer layer and an epitaxial or oriented ferroelectric thin film is formed on the buffer layer. However, they have not yet succeeded in forming an epitaxial or oriented conductive oxide film on the above-mentioned MgO buffer layer.

A thin film of a ferroelectric oxide is expected to be widely applicable to surface elastic wave elements, infrared pyroelectric elements, acoustic optical elements, and electro-optic elements as well as nonvolatile memories for its many excellent properties as a ferroelectric substance, such as ferroelectric properties, piezoelectric properties, pyroelectric properties, and electro-optic effects. In devices using a thin film waveguide structure, preparation of a single crystal thin film is essential for minimizing optical loss and for obtaining polarization characteristics and electro-optic effects as obtained from a single crystal. To this effect, an epitaxial ferroelectrtc thin film of $BaTiO_3$, $PbTiO_3$, $Pb_{1-x}La_x(Zr_{1-y}Ti_y)O_3$ (PLZT), $LiNbO_3$, $KNbO_3$, $Bi_4Ti_3O_{12}$, etc. has been formed on a single crystal oxide substrate by Rf-magnetron sputtering, ion beam sputtering, laser ablation, metal oxide chemical vapor deposition (MOCVD), or the like technique.

For integration with semiconductor elements, it is required to form a ferroelectric thin film on a semiconductor substrate. However, epttaxial growth of a ferroelectric substance directly on a semiconductor substrate is difficult due to the high temperature for growth, mutual diffusion between a semiconductor and a ferroelectrtc substance, and oxidation of a semiconductor.

For these reasons, it is necessary to form a capping layer as a buffer layer on a semiconductor substrate, which allows a ferroelectric substance to grow epitaxially thereon at a low temperature, accelerates epitaxial growth of a ferroelectric thin film, and also acts as a barrier against diffusion. While the refractive index of a ferroelectric substance is generally smaller than that of GaAs, a buffer layer having a still smaller refractive index, if obtained, would make it possible to confine semiconductor laser light within a ferroelectric thin film waveguide, thereby making it possible to prepare a light modulation element on a semiconductor laser or to prepare an optical integrated circuit on an Si semiconductor integrated circuit.

Along this line, the present inventors previously proposed (100) epitaxial growth of MgO on a semiconductor (100) substrate (U.S. patent application Ser. No. 07/798,672, now abandoned filed on Nov. 26, 1991 and Japanese Patent Application No. 319228/92). Taking $BaTiO_3$ on GaAs for instance, the structure thus prepared has a crystallographic relationship of $BaTiO_3$ (001)//MgO (100)//GaAs (100) as to $BaTiO_3$ on GaAs, in plane orientation of $BaTiO_3$ [010]// MgO [001]//GaAs [001].

A thin film electrode and a thin film heating resistor to be used in various electronic components are generally made of metals. However, thin films of Al or Cr are susceptible to oxidation, while thin films of noble metals, e.g., Pd, Ag or Pt, are expensive though resistant to oxidation. JP-A-4-182393 refers to growth of a ferroelectric thin film on $RuO_2$, etc. However, the lattice constant of $RuO_2$ has poor conformity to that of an $ABO_3$ type ferroelectric substance so that it is difficult for a ferroelectric thin film to grow epitaxially on $RuO_2$.

SUMMARY OF THE INVENTION

An object of the present invention is to provide an epitaxial or oriented conductive thin film of an oxide prepared from an organometallic compound, which is useful as a thin film oxide electrode or a thin film oxide resistor.

Another object of the present invention is to provide a process for producing the above-mentioned epitaxial or oriented conductive thin film.

According to the present invention, a conductive substrate of a ferroelectric substance, a semiconductor, etc. for thin film growth is obtained at low cost.

As a result of investigations into an oriented conductive thin film, the present inventors have found that an epitaxial or oriented conductive oxide film obtained by starting with organometallic compounds has a lattice constant and a crystal structure close to those of many ferroelectric substances and thus completed the present invention.

The present invention relates to an epitaxial or oriented conductive thin film of an $ABO_3$ type metal oxide which is formed on a single crystal substrate by applying a solution of a organometallic compound on the single crystal substrate to form a thin film, thermally decomposing the precursor, followed by annealing.

DETAILED DESCRIPTION OF THE INVENTION

Figure 1:
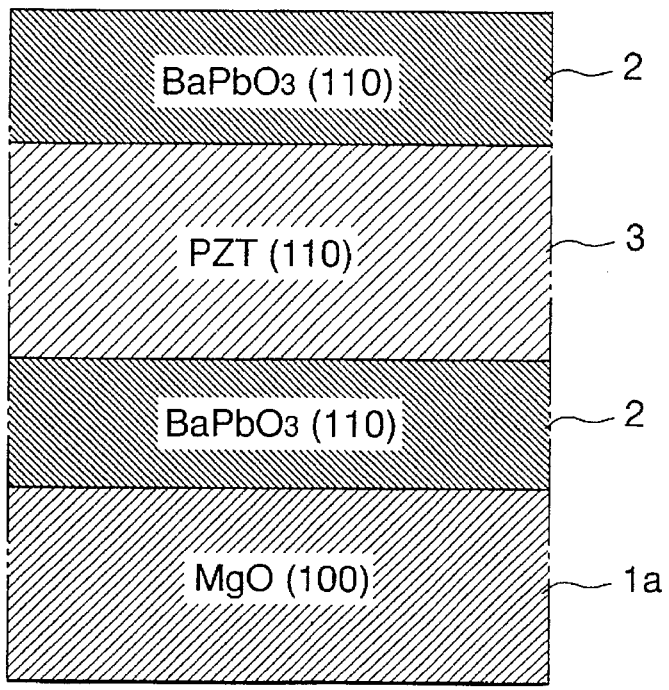
FIG. 1 shows an oriented conductive thin film prepared in Example 1, comprising an MgO (100) substrate having formed thereon oriented $BaPbO_3$ (110)/PZT (110)/$BaPbO_3$ (110).

The raw materials of the oriented conductive thin film of the present invention are organometallic compounds selected from metal alkoxides and organic acid metal salts.

The metal alkoxide used in the present invention preferably has a formula of $Xm-M-(OR)n$, wherein R represents an alkyl group having 1 to 5 carbon atoms, X represent an organic group, M represents a metal selected from the group of Ia, IIa, IIIa, IIb, Iva, IVb, Va, Vb and VIII of the periodic table, m represents an integer of 0 to 2, and n represents an integer of 1 to 4.

Examples of the metal alkoxide include vinyl trimethoxy silane, vinyl triethoxy silane, vinyl tris-2-methoxyethoxy silane, vinyl triacetoxy silane, γ-glycidoxy propyl trimethoxy silane, γ-methacryloxy propyl trimethoxy silane, γ-aminopropyl triethoxy silane, γ-chloropropyl trimethoxy silane, γ-2-aminoethyl aminopropyl trimethyl silane, γ-mercaptopropyl trimethoxy silane, γ-ureidopropyl triethoxy silane, β-3,4-ethoxycyclohexyl ethyltrimethoxy silane, alkyl(phenyl)alkoxy silane, alkyl silicate, tetrapropoxy titanium, tetrabutoxy titanium, dibutoxy titanium-bis(octylene glycolato), dipropoxy titanium-bis(ethylacetyl acetato), diproproxy titanium-bis(triethanolaminato), zirconium dipropoxydiacetyl acetonato, tributoxy zirconium acetyl acetonato, tetraalkoxy zirconium, aluminum isopropylato, aluminum diisopropoxy monoethyl acetato, aluminum-n-butoxide monomethyl acetato, aluminum diisobutoxy monomethyl acetato and aluminum di-n-butoxy monoethyl acetoacetato.

The organic acid metal salt is preferably metal acetyl acetonato, and more preferably zirconium acetyl acetonato. The metal elements in the alkoxides or organic acid salts correspond to those constituting the $ABO_3$ type compound oxides hereinafter described.

These raw materials are reacted with a solvent selected from alcohols, diketones, keto acids, alkyl esters, oxyacids, oxy ketones, fatty acids (e.g., acetic acid) and the like, or dissolved in such a solvent.

Of the solvent such as alcohols, diketones, keto acids, alkyl esters, oxyacids, oxy ketones, fatty acids and the like, a solvent which is apt to make an alcohol substitution reaction with a metal alkoxide is most preferable, and includes, for example, ethanol, propanol, butanol, methoxyethanol, ethoxyethanol, etc. The solvent is preferably used in an amount to provide a concentration of the organometallic compound being 0.01 to 1.0 mol/l based on the solvent.

The solution of the reaction product between the organometallic compounds and a solvent or a solution of the organometallic compounds in a solvent is then applied to a substrate by spin coating, dip coating, spray coating, screen printing, ink jetting, or a like application technique.

The substrate which can be used in the present invention is a single crystal substrate including an oxide, such as MgO, $MgAl_2O_4$, $SrTiO_3$, $BaZrO_3$, $LaAlO_3$, ZnO, or $Al_2O_3$; a simple substance of semiconductor, such as Si, Ge, or diamond; a III–V compound semiconductor, such as AlAs, AlSb, AlP, GaAs, GaSb, InP, InAs, InSb, AlGaP, AlInP, AlGaAs, AlInAs, AlAsSb, GaInAs, GaInSb, GaAsSb, or InAsSb; and a II–VI compound semiconductor, such as ZnS, ZnSe, ZnTe, CdS, CdSe, CdTe, HgSe, or HgTe. These single crystal substrates may have an epitaxial or oriented buffer layer on the surface thereof. The buffer layer includes a single-layered buffer layer comprising MgO, $MgAl_2O_4$, etc.

and a double- or multi-layered buffer layer, such as Pb($Zr_{0.53}Ti_{0.47}$)$O_3$ (PZT)/MgO.

The organometallic starting materials may be used after being hydrolyzed but is desirably used without being hydrolyzed for obtaining an epitaxial or highly oriented thin film of a ferroelectric substance.

The coated substrate is then heated to thermally decompose the coating layer within a temperature range of from 100° to 500° C., preferably from 250° to 400° C. in which no crystallization may occur. The heating is carried out in an oxygen-containing atmosphere, preferably in an oxygen stream, at a rate of temperature rise of from 0.1° to 500° C./sec, preferably from 1° to 500° C./sec for completing the heat treatment in a reduced time and most preferably from 5° to 50° C./sec. The coating and thermal decomposition are conducted once or, if desired, repeatedly.

Subsequently, the coated substrate is subjected to annealing at a temperature ranging from 300° to 1200° C., preferably from 400° to 900° C., in an oxygen-containing atmosphere or an oxygen-free atmosphere, or first in an oxygen-containing atmosphere and then in an oxygen-free atmosphere to thereby obtain an epitaxial or oriented conductive thin film of an $ABO_3$ type oxide. The rate of temperature rise for annealing ranges from 0.1° to 500° C./sec, preferably from 1° to 500 C./sec for completing the heat treatment in a reduced time and most preferably from 5° to 50° C./sec. The atmosphere for thermal decomposition and annealing may be either a dry atmosphere or a forcedly humidified atmosphere.

The $ABO_3$ type oxide to be formed preferably includes $BaPbO_3$ and complex oxides represented by ($Ba_{1-2x/m}C_{2x/m}$)($Pb_{1-4/n}D_{4y/n}$)$O_3$, wherein C represents at least one element selected from the groups Ia, IIa, and IIIa of the periodic table; D represents at least one element selected from the groups IIb, IVa, IVb, Va, Vb, and VIII of the periodic table; 0<x; y≦1; m represents the valency of C; and n represents the valency of D. In the complex oxides, C is preferably at least one of Li, Na, K, Sr, Y, La, Ce, and Gd; and D is preferably at least one of Si, Ti, V, Fe, Co, Zn, Zr, Nb, Sn, Sb, Ta, and Bi.

The conductive thin film obtained by the thermal decomposition followed by annealing preferably has a crystallized state.

On the oriented conductive thin film of the present invention, an epitaxial or oriented thin film of an $ABO_3$ type ferroelectric substance can be formed either by vapor phase growth or a sol-gel method. The $ABO_3$ type ferroelectric substance contains at least one of Li, K, Sr, Ba, La, and Pb as the element A, and at least one of Mg, Ti, Zr, Nb, and Ta as the element B. The raw material of the $ABO_3$ type ferroelectric substance is preferably an organometallic compound of metal alkoxide or organic acid metal salt. The organic ligand of the metal alkoxide and organic acid metal salt is preferably represented by R'O— or R"OR'"O— group, in which R' and R" represents an aliphatic group and R'" represents a divalent aliphatic group which may have an ether bond. The organic moiety preferably includes ethoxide, propoxide, butoxide, methoxyethoxide, ethoxyethoxide, etc. Preferable organometallic compound includes $LiOC_2H_5$, $Nb(OC_2H_5)_5$, $Pb(CH_3COO)_2$, $Zr(O—iC_3H_7)_4$, $Ti(O—iC_3H_7)_4$, $KOC_2H_5$, etc.

It is preferred that the organometallic compound used in the present invention is used in a state not hydrolyzed, and thus the organometallic compound is used in a form of solution of dehydrated alcohol series solvent. For the purpose of obtaining a smooth surface of the film and suppressing a preparation of fine holes, the solvent has preferably 80° C. or more of boiling point at a normal pressure.

Preferable solvent used in the present invention includes, for example, $(CH_3)_2CHOH$ (b.p.:82.3° C.), $CH_3(C_2H_5)CHOH$ (b.p.:99.5° C.), $(CH_3)_2CHCH_2OH$ (b.p.:130.5° C.), $CH_3OCH_2CH_2OH$ (b.p.:124.5° C.), $C_2H_5OCH_2CH_2OH$ (b.p.:135° C.), $C_4H_9OCH_2CH_2OH$ (b.p.:171° C.).

The above-described conductive thin film and ferroelectric thin film can be formed by vapor phase growth, such as electron beam deposition, flash deposition, ion plating, Rf-magnetron sputtering, ion beam sputtering, laser ablation, molecular beam epitaxy (MBE), chemical vapor deposition (CVD), plasma CVD or MOCVD, or a wet process, such as a sol-gel method. Sol-gel method is a method comprising dissolving an organometalltc compound having a hydrolyzable group (e.g. alkoxy group) in water/ alcohol solvent to obtain sol, and drying under heating, thereby removing an organic group to obtain oxide thin film comprising metal atom and oxygen atom. These techniques may be used in combination.

Factors having influences on epitaxial or oriented thin film growth include differences between a substrate and a film in lattice constant, in crystal structure, in crystal symmetry, in coefficient of thermal expansion, in electrostatic surface condition, and the like. A lattice conformity is one of the most decisive factors.

Examples of the oriented conductive thin films composed of a ferroelectric substance layer, a conductive substance layer, and a single crystal substrate with or without a buffer layer are shown in Tables 1 to 5 below.

In Table 1 are shown combinations of a ferroelectric substance having a tetragonal or cubic crystal system, a conductive substance having a cubic crystal system, and a single crystal oxide having a cubic crystal system together with their crystal structure and lattice constant.

TABLE 1

| Thin Layer | Crystal | Crystal Structure | Crystal System | Lattice Constant (Å) a Axis | c Axis |
|---|---|---|---|---|---|
| Ferro- | $BaTiO_3$ | perovskite | tetragonal | 3.994 | 4.038 |
| electric | $PbTiO_3$ | " | " | 3.905 | 4.153 |
| Layer | PZT | " | " | 4.040 | 4.129 |
|  | $KNbO_3$ | " | cubic | 4.015 |  |
| Conductive Layer | $BaPbO_3$ | perovskite | cubic | 4.265 |  |
| Single | $SrTiO_3$ | perovskite | cubic | 3.905 |  |
| Crystal | MgO | NaCl | " | 4.213 |  |
| Substrate (oxide) | $MgAl_2O_4$ | spinel | " | 8.083 (½ = 4.042) |  |

In Table 2 are shown combinations of a ferroelectric substance having a hexagonal crystal system, a conductive substance having a cubic crystal system, and a single crystal oxide having a hexagonal crystal system or a cubic crystal system together with their crystal structure and lattice constant.

TABLE 2

| Thin Layer | Crystal | Crystal Structure | Crystal System | Lattice Constant (Å) a Axis | b or c Axis |
|---|---|---|---|---|---|
| Ferroelectric Layer | LiNbO$_3$ (0001) | ilmenite | hexagonal | 5.149 | 13.862 |
| | LiTaO$_3$ (0001) | " | " | 5.153 | 13.755 |
| Conductive Layer | BaPbO$_3$ (111) | perovskite | cubic | 4.265 | |
| Single Crystal Substrate (oxide) | ZnO (0001) | wurtzite | hexagonal | 3.250 | 5.207 |
| | Al$_2$O$_3$ (0001) | corundum | " | 4.758 | 12.991 |
| | MgO (111) | NaCl | cubic | 4.213 | |

In Table 3 are shown combinations of a ferroetectric substance layer, a conductive substance layer, and a single crystal oxide substrate having thereon a buffer layer together with their crystal structure and lattice constant.

TABLE 3

| Thin Layer | Crystal | Crystal Structure | Crystal System | Lattice Constant (Å) a Axis | c Axis |
|---|---|---|---|---|---|
| Ferroelectric Layer | BaTiO$_3$ | perovskite | tetragonal | 3.994 | 4.038 |
| | PbTiO$_3$ | " | " | 3.905 | 4.153 |
| | PZT | " | " | 4.040 | 4.129 |
| | KNbO$_3$ | " | cubic | 4.015 | |
| Conductive Layer | BaPbO$_3$ | perovskite | cubic | 4.265 | |
| Buffer Layer | PZT | perovskite | tetragonal | 4.040 | 4.129 |
| Single Crystal Base (oxide) | SrTiO$_3$ | perovskite | cubic | 3.905 | |
| | MgO | NaCl | " | 4.213 | |

In Table 4 are shown combinations of a ferroelectric substance layer, a conductive substance layer, and a semiconductor single crystal substrate having thereon a buffer layer together with their crystal structure and lattice constant.

TABLE 4

| Thin Layer | Crystal | Crystal Structure | Crystal System | Lattice Constant (Å) a Axis | c Axis |
|---|---|---|---|---|---|
| Ferroelectric Layer | BaTiO$_3$ | perovskite | tetragonal | 3.994 | 4.038 |
| | PbTiO$_3$ | " | " | 3.905 | 4.153 |
| | PZT | " | " | 4.040 | 4.129 |
| | KNbO$_3$ | " | cubic | 4.015 | |
| Conductive Layer | BaPbO$_3$ | perovskite | cubic | 4.265 | |
| Buffer Layer | MgO | NaCl | cubic | 4.213 | |
| | MgAl$_2$O$_4$ | spinel | " | 8.083 (½ = 4.042) | |
| Single Crystal Substrate (semiconductor) | Si | diamond | cubic | 5.430 | |
| | GaAs | zincblende | " | 5.653 | |

In Table 5 are shown combinations of a ferroelectric substance layer, a conductive substance layer, and a semiconductor single crystal substrate having thereon a double-layered buffer layer together with their crystal structure and lattice constant.

TABLE 5

| Thin Layer | Crystal | Crystal Structure | Crystal System | Lattice Constant (Å) a Axis | c Axis |
|---|---|---|---|---|---|
| Ferroelectric Layer | BaTiO$_3$ | perovskite | tetragonal | 3.994 | 4.038 |
| | PbTiO$_3$ | " | " | 3.905 | 4.153 |
| | PZT | " | " | 4.040 | 4.129 |
| | KNbO$_3$ | " | cubic | 4.015 | |
| Conductive Layer | BaPbO$_3$ | perovskite | cubic | 4.265 | |
| Second Buffer Layer | PZT | perovskite | tetragonal | 4.040 | 4.129 |
| First Buffer Layer | MgO | NaCl | cubic | 4.213 | |
| | MgAl$_2$O$_4$ | spinel | " | 8.083 (½ = 4.042) | |
| Single Crystal Substrate (semiconductor) | Si | diamond | cubic | 5.430 | |
| | GaAs | zincblende | " | 5.653 | |

The present invention will now be illustrated in greater detail with reference to Examples, but it should be understood that the present invention is not deemed to be limited thereto.

EXAMPLE 1

Equimolar amounts of Ba(OC$_2$H$_5$)$_2$ and Pb(OC$_3$H$_7$)$_2$ were dissolved in 2-methoxyethanol having been dehydrated over Molecular Sieves to prepare a 0.6M solution. The solution was evaporated with stirring for 2 hours and then refluxed for 22 hours to obtain a double alkoxide BaPb(OC$_2$H$_4$OCH$_3$)$_4$ as a BaPbO$_3$ precursor. This alcohol substitution reaction was confirmed by the $^1$H-NMR spectrum. The formation of the double alkoxide as a BaPbO$_3$ precursor is of importance for controlling the Ba/Pb ratio at 1/1 and for uniformity on a molecular level.

The resulting precursor solution was filtered through a filter having a pore size of 0.2 µm and applied to an MgO (100) single crystal substrate by spin coating at 2000 rpm. All the above-described operation was conducted in a nitrogen atmosphere. Prior to the spin coating, the MgO substrate was washed with a solvent, etched with hydrochloric acid, rinsed with deionized water, and finally dried by spin coating of ethanol in a nitrogen stream.

The coated substrate was placed in an oxygen atmosphere having been bubbled through deionized water at room temperature and rapidly heated at a rate of 10° C./sec to 300° C., at which the substrate was maintained for 2 minutes, and further heated to 450° C., 550° C. or 650° C., at which the substrate was maintained for 30 minutes. The power source of the electric oven was cut off, and the substrate was allowed to cool.

The BaPbO$_3$ thin film (thickness:0.1 µm) obtained by thermal decomposition at 300° C. followed by annealing at 450° C. in an oxygen stream had an X-ray diffraction pattern showing crystallization in (110) orientation despite such a high rate of temperature rise as 10° C./sec.

For comparison the coated substrate was heated at a rate of temperature rise of 10° C./min to 650° C. for crystallization without conducting the thermal decomposition at 300° C. Observation of the resulting BaPbO$_3$ thin film under scanning electron microscope (SEM) revealed extremely poor quality with cracks and pores. To the contrary, the BaPbO$_3$ thin films obtained by the process including thermal decomposition at 300° C. showed excellent film properties under SEM. It is thus seen that thermal decomposition prior to crystallization is effective where heating is conducted at a high rate of temperature rise.

The resulting BaPbO$_3$ thin films (annealed at 450°C., 550° C. or 650° C.) had a volume resistivity as low as 9×10$^{-4}$ Ω·cm, 3×10$^{-4}$ Ω·cm, or 2×10$^{-4}$ Ω·cm, respectively, as measured by a four-terminal method. BaPbO$_3$ shows metallic conduction of electricity but no transparency to visible light due to a narrow band gap. However, the BaPbO$_3$ thin films obtained in the present invention were observed to have transparency to visible light to some extent depending on the annealing temperature, the film thickness or the composition (as observed in Example 2 hereinafter described).

Then, Pb(CH$_3$COO)$_2$, Zr(O—i—C$_3$H$_7$)$_4$, and Ti(O—i—C$_3$H$_7$)$_4$ at a Pb:Zr:Ti molar ratio of 1.00:0.53:0.47 were dissolved in 2-methoxyethanol. The solution was evaporated for 6 hours and then refluxed for 18 hours to obtain a solution of a precursor for Pb(Zr$_{0.53}$Ti$_{0.47}$)O$_3$ (PZT) having a Pb concentration of 0.5M. The precursor solution was applied on the above-prepared substrate having a structure of BaPbO$_3$ (110)/MgO (100) by spin coating at 2000 rpm. All the above operation was conducted in a nitrogen atmosphere.

The coated substrate was heated at a rate of 10° C./sec to 350° C. in an oxygen atmosphere for thermal decomposition. The substrate was further heated at 650° C. for 30 minutes whereby PZT thin film crystallized to provide a (110)-oriented PZT thin film. A BaPbO$_3$ thin film was further formed on the PZT thin film in the same manner as described above. The resulting oriented conductive thin film has a layer structure shown in FIG. 1, comprising oxide substrate 1a (MgO), conductive layer 2 (BaPbO$_3$), ferroelectric layer 3 (PZT), and conductive layer 2 (BaPbO$_3$) in this order.

Voltage was applied to the thus prepared element (BaPbO$_3$/PZT/BaPbO$_3$/MgO) using the two BaPbO$_3$ layers as upper and lower electrodes, and polarization characteristics of PZT were observed. As a result, PZT exhibited satisfactory switching characteristics and fatigue characteristics as compared with an element using metallic electrodes.

EXAMPLE 2

Ba(OC$_2$H$_5$)$_2$, Sr(OC$_2$H$_5$)$_2$, and Pb(OC$_3$H$_7$)$_2$ at a Ba:Sr:Pb molar ratio of 0.7:0.3:1.0 were dissolved in dehydrated 2-methoxyethanol to prepare a solution having a Pb concentration of 0.6M. The solution was evaporated with stirring for 2 hours and then refluxed for 22 hours to obtain a solution of a complex alkoxide (Ba$_{0.7}$Sr$_{0.3}$)Pb(OC$_2$H$_4$OCH$_3$)$_4$ as a precursor. The precursor solution was filtered through a filter having a pore size of 0.2 μm and applied to an SrTiO$_3$ (100) single crystal substrate by spin coating at 2000 rpm. All the above operation was conducted in a nitrogen atmosphere. Prior to the spin coating, the SrTiO$_3$ single crystal substrate was subjected to solvent washing, etching, rinsing, and drying in the same manner as in Example 1.

The coated substrate was heated in a dry oxygen atmosphere at a rate of 10° C./sec and maintained at 300° C. and then at 650° C. The power source of the electric oven was cut off to allow the substrate to cool to obtain a (100)-oriented (Ba$_{0.7}$Sr$_{0.3}$)PbO$_3$ thin film. The thin film had a low volume resistivity of 2×10$^{-4}$ Ω·cm.

EXAMPLE 3

An SrTiO$_3$ (100) single crystal substrate was spin coated with a solution of a PZT precursor at 2000 rpm in the same manner as in Example 1. The coated substrate was heated in an oxygen atmosphere at a rate of 10° C./sec to 350° C. to thermally decompose the coating layer and then heated at 650° C. to obtain an epitaxially grown PZT thin film in (001) orientation. Using the PZT thin film as an epitaxial buffer layer, a BaPbO$_3$ thin film was formed thereon in the same manner as in Example 1. The BaPbO$_3$ epitaxially crystallized in (100) orientation.

Further, a PZT thin film was formed thereon in the same manner as in Example 1 to obtain a multi-layered epitaxial structure of PZT (001)/BaPbO$_3$ (100)/PZT (001)/SrTiO$_3$ (100).

EXAMPLE 4

An epitaxial buffer layer was formed on a GaAs (100) single crystal substrate by excimer laser deposition, in which the surface of a target is instantaneously heated and evaporated by UV laser pulses, under the following conditions.

Excimer laser: XeCl excimer laser having a wavelength of 308 nm

Pulse Frequency: 4 Hz

Pulse Length: 17 ns

Energy: 130 mJ (energy density on the target surface: 1.3 J/cm$^2$)

Metallic magnesium was used as a target to make MgO grow. Prior to the deposition, the GaAs single crystal substrate was washed with a solvent, etched with a sulfuric acid-based solution, rinsed with deionized water and ethanol, and spin-dried with ethanol in a nitrogen stream.

Figure 2:
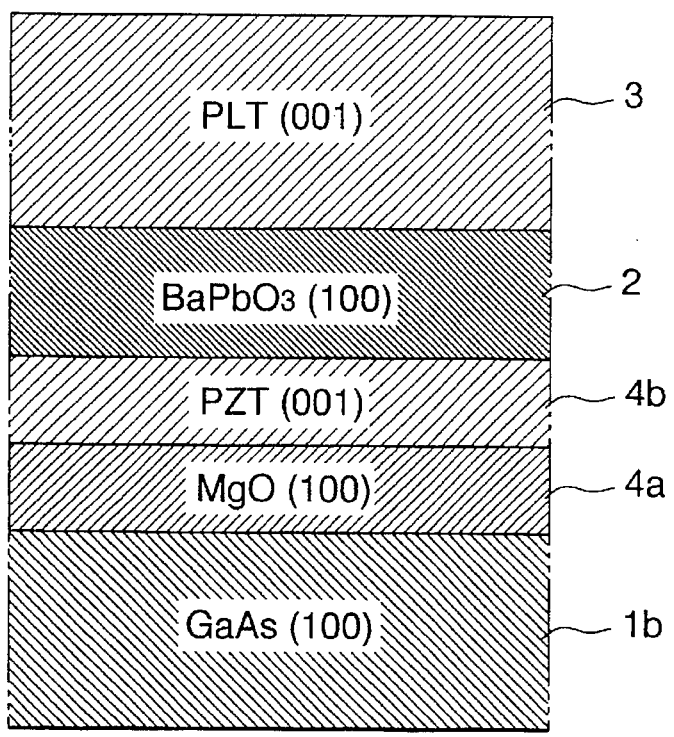
FIG. 2 shows an oriented conductive thin film having a multi-layered epitaxial structure prepared in Example 4, comprising a GaAs (100) substrate having formed thereon MgO (100)/PZT (001)/$BaPbO_3$ (110)/PLT (001).

The substrate immediately after spin-drying was set in a deposition chamber and heated to a prescribed temperature, and the target was heated by a UV laser to deposit MgO on the substrate to form an epitaxial MgO (100) buffer layer having a thickness of 500 Å. On the buffer layer were formed a PZT layer, a BaPbO$_3$ layer, and a (Pb$_{0.72}$La$_{0.28}$)TiO$_3$ (PLT) layer in the same manner as in Example 1 to obtain a multi-layered epitaxial structure of PLT (001)/BaPbO$_3$ (100)/PZT (001)/MgO (100)/GaAs (100). The structure of the resulting oriented conductive thin film is shown in FIG. 2. As shown in the Fig., the layer structure comprises semiconductor substrate 1b having formed thereon first buffer layer 4a, second buffer layer 4b, conductive layer 2, and ferroelectric layer 3 in this order.

EXAMPLE 5

Equimolar amounts of Ba(OC$_3$H$_7$)$_2$ and Pb(OC$_3$H$_7$)$_2$ were disolved in 2-methoxyethanol having been dehydrated over Molecular Sieves to prepare a 0.6M solution. The solution was evaporated with stirring for 2 hours and then refluxed for 22 hours to obtain a double alkoxide BaPb(OC$_2$H$_4$OCH$_3$)$_4$ as a BaPbO$_3$ precursor. This alcohol substitution reaction was confirmed by the $^1$-NMR spectrum. The formation of the double alkoxide is of importance for controlling the Ba/Pb ratio at 1/1 and for uniformity on a molecular level.

The resulting precursor solution was filtered through a filter having a pore size of 0.2 μm and applied to a quartz glass substrate by spin coating at 2000 rpm. All the above operation was conducted in a nitrogen atmosphere. Prior to the spin coating, the quartz glass substrate was washed with a solvent, rinsed with deionized water, and dried by spin coating of ethanol in a nitrogen stream.

The coated substrate was placed in an oxygen-containing atmosphere having been bubbled through deionized water at room temperature and rapidly heated in an electric oven at a rate of 10° C./sec to 300° C., at which the substrate was maintained for 2 minutes, and further heated to 450° to 600° C., at which the substrate was maintained for 30 minutes. The power source of the electric oven was cut off, and the substrate was allowed to cool.

The $BaPbO_3$ thin film (thickness:0.1 μm) obtained by thermal decomposition at 300° C. followed by annealing at 450° C. or higher in an oxygen stream had an X-ray diffraction pattern showing crystallization despite such a high rate of temperature rise as 10° C./sec.

For comparison, the coated substrate was heated at a rate of temperature rise of 10° C./min to 600° C. for crystallization without conducting the thermal decomposition at 300° C. Observation of the resulting $BaPbO_3$ thin film under SEM revealed extremely poor quality with cracks and pores. To the contrary, the $BaPbO_3$ thin films obtained by the process including thermal decomposition at 300° C. showed excellent film properties under SEM. It is thus seen that thermal decomposition prior to crystallization is effective where heating is conducted at a high rate of temperature rise.

The resulting $BaPbO_3$ thin films (annealed at 450° C. and 550° C.) had a volume resistivity as low as $2\times10^{-3}$ Ω·cm and $4\times10^{-4}$ Ω·cm, respectively, as measured by a four-terminal method. $BaPbO_3$ shows metallic conduction of electricity but no transparency to visible light due to a narrow band gap. However, the $BaPbO_3$ thin films obtained in the present invention showed transparency to visible light to some extent depending on the annealing temperature, the film thickness or the composition (as observed in Example 6 hereinafter described).

Then, $Pb(CH_3COO)_2$, $Zr(O—i—C_3H_7)_4$, and $Ti(O—i—C_3H_7)_4$ at a Pb:Zr:Ti molar ratio of 1.00:0.53:0.47 were dissolved in 2-methoxyethanol. The solution was evaporated for 6 hours and then refluxed for 18 hours to obtain a solution of a precursor for $Pb(Zr_{0.53}Ti_{0.47})O_3$ (PZT) having a Pb concentration of 0.5M. The precursor solution was applied on the above-prepared substrate having a structure of $BaPbO_3$/quartz glass substrate by spin coating at 2000 rpm. All the above operation was conducted in a nitrogen atmosphere.

The coated substrate was heated at a rate of 10° C./sec to 300° C. in an oxygen atmosphere for thermal decomposition. The substrate was further heated at 600° C. for 30 minutes whereby PZT thin film crystallized to provide a PZT thin film. A $BaPbO_3$ thin film was further formed on the PZT thin film in the same manner as described above.

Voltage was applied to the thus prepared element ($BaPbO_3$/PZT/$BaPbO_3$/quartz glass) using the two $BaPbO_3$ layers as upper and lower electrodes, and polarization characteristics of PZT were observed. As a result, PZT exhibited satisfactory switching characteristics and fatigue characteristics as compared with an element using metallic electrodes.

EXAMPLE 6

$Ba(OC_2H_5)_2$, $Sr(OC_2H_5)_2$, and $Pb(OC_3H_7)_2$ at a Ba:Sr:Pb molar ratio of 0.7:0.3:1.0 were dissolved in dehydrated 2-methoxyethanol to prepare a solution having a Pb concentration of 0.6M. The solution was evaporated with stirring for 2 hours and then refluxed for 22 hours to obtain a solution of a compound alkoxide $(Ba_{0.7}Sr_{0.3})Pb(Oc_2H_4OCH_3)_4$. The resulting precursor solution was filtered through a filter having a pore size of 0.2 μm applied to an $Al_2O_3$ substrate by spin coating at 2000 rpm. All the above operation was conducted in nitrogen atmosphere. Prior to the spin coating, the $Al_2O_3$ substrate was subjected to solvent washing, rinsing with deionized water, and drying by spin coating of ethanol in a nitrogen stream.

The coated substrate was heated in a dry oxygen atmosphere at a rate of 10° C./sec and maintained at 300° C. and then at 650° C. The power source of the electric oven was cut off to allow the substrate to cool to obtain a crystalized $(Ba_{0.7}Sr_{0.3})PbO_3$ thin film. The thin film had a low volume resistivity of $4\times10^{-3}$ Ω·cm.

A PZT thin film was crystallized on the $(Ba_{0.7}Sr_{0.3})PbO_3$/$Al_2O_3$ substrate in the same manner as in Example 5, and Pt was deposited on the PZT thin film by sputtering to obtain a Pt/PZT/$(Ba_{0.7}Sr_{0.3})PbO_3$/$Al_2O_3$ element. When voltage was applied to the element using Pt as an upper electrode and $(Ba_{0.7}Sr_{0.3})PbO_3$ as a lower electrode, PZT exhibited satisfactory switching characteristics.

EXAMPLE 7

Equimolar amounts of $Ba(OC_2H_5)_2$ and $Pb(OC_3H_7)_2$ were dissolved in anhydrous 2-methoxyethanol to prepare a 0.5M solution. The solution was evaporated with stirring for 2 hours and then refluxed for 22 hours to obtain a solution of a double alkoxide $BaPb(OC_2H_4OCH_3)_4$ as a precursor for $BaPbO_3$. The precursor solution was filtered through a filter having a pore size of 0.2 μm and applied to an MgO (100) single crystal substrate by spin coating at 2000 rpm. All the above operation was conducted in a nitrogen atmosphere. Prior to the spin coating, the substrate was subjected to solvent washing with a solvent, etching with hydrochloric acid, rinsing with deionized water, and finally drying by spin-coating of ethanol in a nitrogen stream.

The coated substrate was placed in an oxygen atmosphere having been bubbled through deionized water at room temperature and rapidly heated in an electric oven at a rate of 10° C./sec to 300° C., at which the substrate was maintained for 2 minutes, and further heated to 650° C., at which the substrate was maintained for 30 minutes. The power source of the electric oven was cut off, and the substrate was allowed to cool to obtain a (110)-oriented $BaPbO_3$ thin film having a thickness of 0.1 μm. The $BaPbO_3$ thin film had an X-ray diffraction pattern showing a crystal state.

The $BaPbO_3$ thin film had a volume resistivity as low as $2\times10^{-4}$ Ω·cm as measured by a four-terminal method. $BaPbO_3$ shows metallic conduction of electricity but no transparency to visible light due to a narrow band gap. However, the $BaPbO_3$ thin films obtained in the present invention were observed to have transparency to visible light to some extent depending on the annealing temperature, the film thickness or the composition.

Then, $Pb(CH_3COO)_2$, $Zr(O—i—C_3H_7)_4$, and $Ti(O—i—C_3H_7)_4$ at a Pb:Zr:Ti molar ratio of 1.00:0.53:0.47 were dissolved in 2-methoxyethanol. The solution was evaporated for 6 hours and then refluxed for 18 hours to obtain a solution of a precursor for $Pb(Zr_{0.53}Ti_{0.47})O_3$ (PZT) having a Pb concentration of 0.5M. The precursor solution was applied on the above-prepared $BaPbO_3$ (110)/MgO (100) substrate by spin coating at 2000 rpm. All the above operation was conducted in a nitrogen atmosphere.

Figure 3:
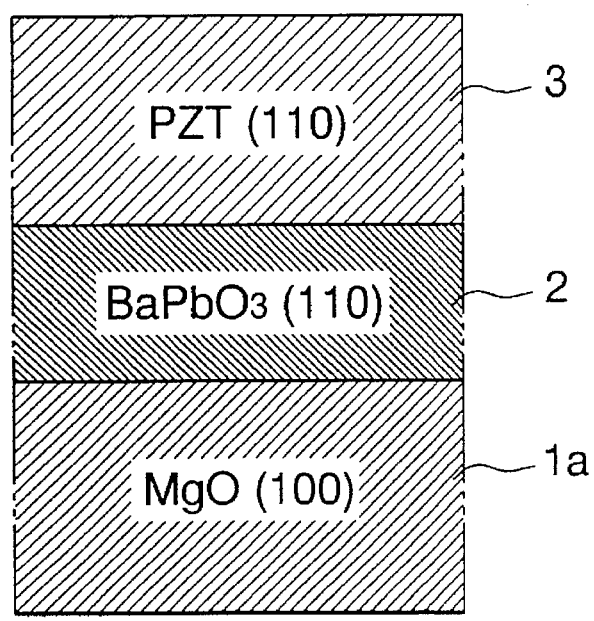
FIG. 3 shows an oriented ferroelectric thin film prepared in Example 7, comprising an MgO (100) substrate having formed thereon PZT (110)/$BaPbO_3$ (110).

The coated substrate was heated at a rate of 10° C./sec and thermally decomposed at 350° C. for 1 minute in an oxygen atmosphere. The substrate was further heated at 650° C. for 30 minutes whereby PZT thin film crystallized to provide an oriented ferroelectric thin film having the structure shown in FIG. 3, which was composed of oxide substrate 1a having formed thereon conductive layer 2 comprising BaPbO$_3$ (110), and ferroelectric layer 3 comprising a (110)-ortented PZT thin film.

A BaPbO$_3$ thin film was further formed on the PZT thin film in the same manner as described above.

Voltage was applied to the thus prepared element (BaPbO$_3$/PZT/BaPbO$_3$/MgO) using the two BaPbO$_3$ layers as upper and lower electrodes, and polarization characteristics of PZT were observed. As a result, PZT exhibited satisfactory switching characteristics and fatigue characteristics as compared with an element using metallic electrodes.

EXAMPLE 8

Figure 4:
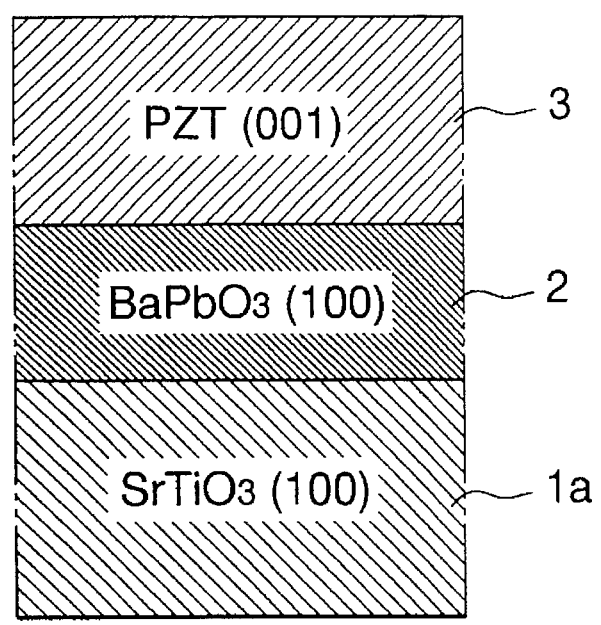
FIG. 4 shows an oriented ferroelectric thin film prepared in Example 8, comprising an $SrTiO_3$ (100) substrate having formed thereon PZT (001)/$BaPbO_3$ (100).

An oriented thin film was obtained in the same manner as in Example 7, except for replacing the MgO single crystal substrate with an SrTiO$_3$ (100) single crystal substrate. The resulting thin film had a structure shown in FIG. 4, composed of substrate 1a having provided thereon conductive layer 2 comprising (100)-oriented BaPbO$_3$ and ferroelectric layer 3 comprising a (001)-oriented PZT thin film.

Examples of combinations of a ferroelectric substance showing epitaxy or orientation growth, a conductive substance, and a single crystal oxide substrate as used in Examples 7 and 8 are shown in Table 1.

A BaPbO$_3$ thin film was again formed on the PZT thin film in the same manner as in Example 7 to obtain a BapbO$_3$/PZT/BaPbO$_3$/SrTiO$_3$ element. With voltage applied to the BaPbO$_3$ layers as upper and lower electrodes, PZT exhibited satisfactory switching characteristics and fatigue characterized as compared with an element using metallic electrodes.

EXAMPLE 9

Ba(OC$_2$H$_5$)$_2$, Sr( OC$_2$H$_5$)$_2$, and Pb(OC$_3$H$_7$)$_2$ at a Ba:Sr:Pb molar ratio of 0.8:0.2:1.0 were dissolved in anhydrous 2-methoxyethanol to prepare a solution having a Pb concentration of 0.5M. The solution was evaporated with stirring for 2 hours and then refluxed for 22 hours to obtain a solution of a compound alkoxide (Ba$_{0.8}$SR$_{0.2}$)Pb (OC$_2$H$_4$OCH$_3$)$_4$ as a precursor for (Ba$_{0.8}$Sr$_{0.2}$)PbO$_3$. The precursor solution was filtered through a filter having a pore size of 0.2 μm and applied to an Al$_2$O$_3$ (0001) single crystal substrate by spin coating at 2000 rpm. All the abave operation was conducted in a nitrogen atmosphere. Prior to the spin coating, the Al$_2$O$_3$ substrate was subjected to solvent washing, etching, rinsing, and drying in the same manner as in Example 7.

The coated substrate was heated in a dry oxygen atmosphere at a rate of 10° C./sec and maintained at 300° C. and then at 650° C. The power source of the electric oven was cut off to allow the substrate to cool to obtain a (111)-oriented (Ba$_{0.8}$Sr$_{0.2}$)PbO$_3$ thin film. The thin film had a low volume resistivity of 5×10$_{-4}$ Ω·cm.

LiOC$_2$H$_5$ and Nb(OC$_2$H$_5$)$_5$ at a prescribed Li:Nb molar ratio (1.0:1.0) were dissolved in anhydrous 2-methoxyethanol to prepare a 0.5M solution. The solution was evaporated with stirring for 2 hours and then refluxed for 22 hours to obtain a solution of a double alkoxide LiNb(OC$_2$H$_4$OCH$_3$)$_6$ as a precursor for LiNbO$_3$. After filtration through a filter having a pore size of 0.2 μm, the precursor solution was applied on the (Ba$_{0.8}$Sr$_{0.2}$)PbO$_3$ (111)/Al$_2$O$_3$ (0001) single crystal substrate by spin coating at 2000 rpm. All the above operation was conducted in a nitrogen atmosphere. Prior to the spin coating, the Al$_2$O$_3$ substrate was subjected to solvent washing, etching, rinsing, and drying in the same manner as in Example 7.

Figure 5:
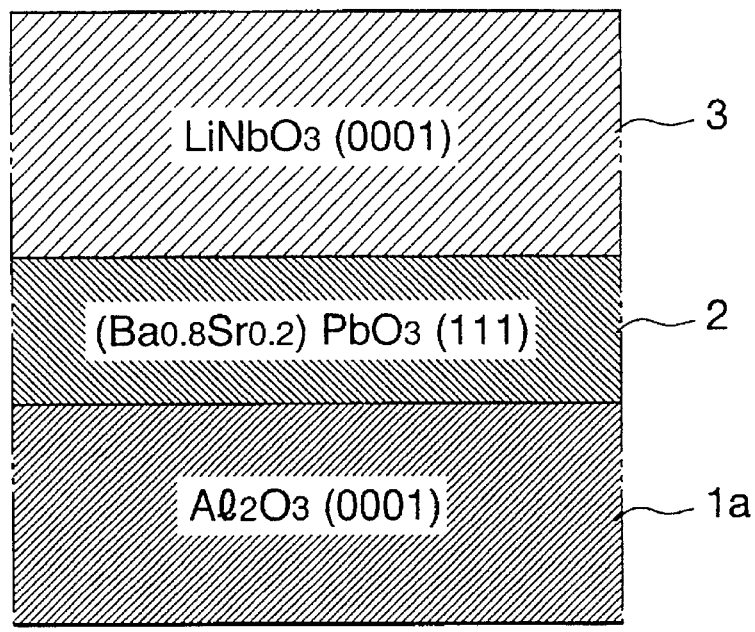
FIG. 5 shows an oriented ferroelectric thin film prepared in Example 9, comprising an $Al_2O_3$ (0001) substrate having formed thereon $LiNbO_3$ (0001)/$(Ba_{0.8}Sr_{0.2})PbO_3$ (111).

While (Ba$_{0.8}$Sr$_{0.2}$)PbO$_3$ has a cubic crystal system, the (0001) face of a ferroelectric substance having a hexagonal system is equal to the (111) face of BaPbO$_3$ in terms of symmetry. Accordingly, a (0001)-oriented LiNbO$_3$ thin film could be obtained by the above spin coating to provide a thin film structure of LiNbO$_3$ (0001)/(Ba$_{0.8}$Sr$_{0.2}$)PbO$_3$ (111)/Al$_2$O$_3$ (0001) as shown in FIG. 5.

Examples of combinations of a ferroelectric substance having a hexagonal system, a conductive substance, and a single crystal substrate as used in Example 9 are shown in Table 2.

EXAMPLE 10

An SrTiO$_3$ (100) single crystal substrate was spin coated with a solution of a PZT precursor at 2000 rpm in the same manner as in Example 7. The coated substrate was heated in an oxygen atmosphere at a rate of 10° C./sec and maintained at 350° C. for thermal decomposition and then at 650° C. for annealing to obtain an epitaxial PZT thin film in (001) orientation. On the PZT thin film as an epitaxialaxial buffer layer was formed a BaPbO$_3$ thin layer in the same manner as in Example 7 whereby BaPbO$_3$ epitaxially crystallized in (100) orientation.

Figure 6:
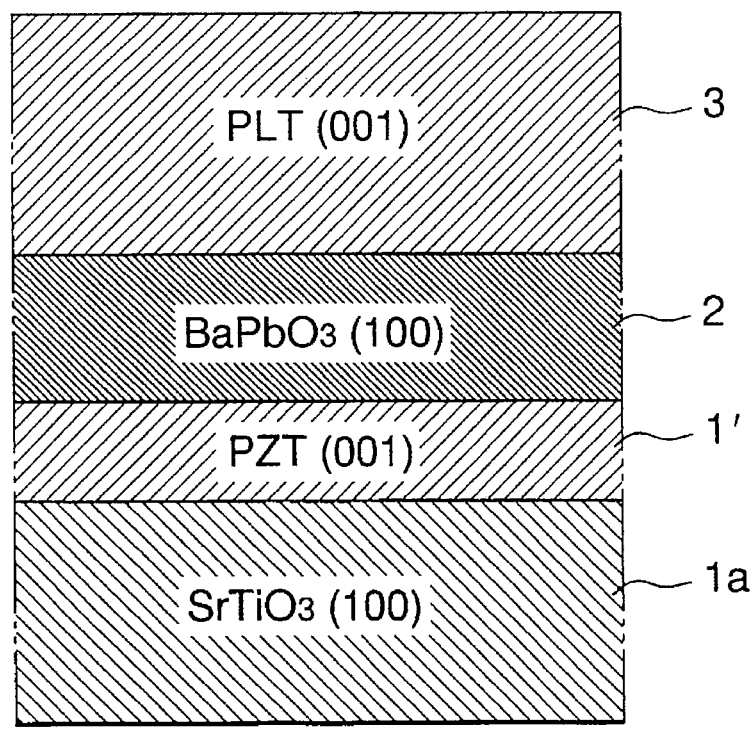
FIG. 6 shows an oriented ferroelectric thin film having a multi-layered structure prepared in Example 10, comprising an $SrTiO_3$ (100) substrate having formed thereon epitaxial PLT (001)/$BaPbO_3$ (100)/PZT (001).

A (Pb$_{0.72}$La$_{0.28}$)TiO$_3$ (PLT) thin film was formed thereon to a thickness of 0.35 μm in the same manner as in Example 7 to obtain a multi-layered epitaxial structure of PLT (001)/BaPbO$_3$ (100)/PZT (001)/SrTiO$_3$ (100) as shown in FIG. 6. The oriented ferroelectric thin film of FIG. 6 is composed of oxide substrate 1a having thereon buffer layer 1', conductive layer 2, and ferroelectric layer 3 in this order.

Examples of combinations of a ferroelectric substance layer, a conductive substance layer, a buffer layer, and a single crystal substrate as used in Example 10 are shown in Table 3.

Figure 7:
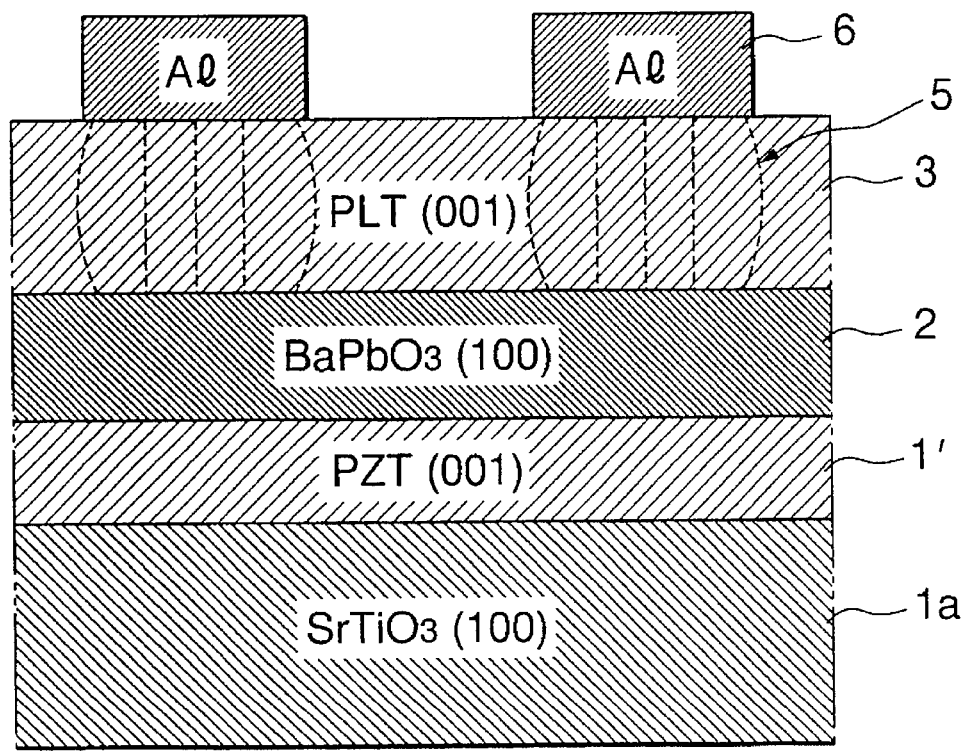
FIG. 7 shows an optical switching device utilizing electro-optic effects, comprising the oriented ferroelectric thin film of Example 10 having an upper electrode on the PLT thin film thereof.
Figure 8:
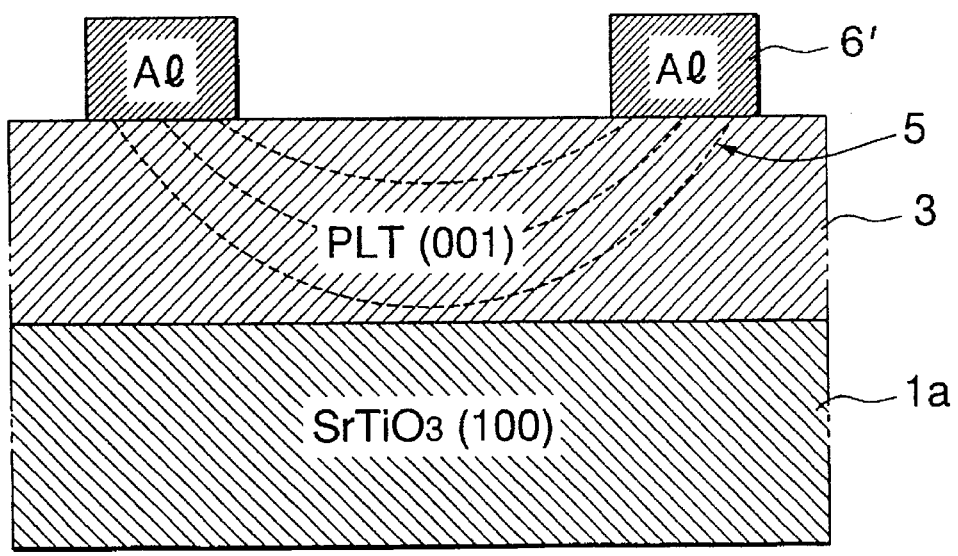
FIG. 8 shows an optical switching device utilizing electro-optic effects, having an electrode on the PLT, which has a conventional structure with no conductive layer.

An aluminum upper electrode in a comb form was applied on the surface of the PLT thin film as shown in FIG. 7, and laser light was introduced into tHe PLT thin film waveguide by prism coupling. As shown in the FIG. 7, with voltage applied between upper electrode 6 (Al) and lower electrode 2 (BaPbO$_3$), the introduced laser light could be switched by Bragg reflection due to the electro-optic effects of lines of electric force 5. Compared with a general coplanar type element having no lower electrode but only opposing comb electrodes 6' on the surface of PLT as shown in FIG. 8, the element of FIG. 7 makes it easy to equalize the electrode distance to the film thickness of PLT, i.e., 0.35 μm to thereby apply voltage effectively in the thickness direction of PLT. As a result, the driving voltage can be reduced, and an element can be prepared with extreme ease because the electrode distance can be controlled with no restriction of microprocessing of electrodes.

Thus, since an epitaxial electrode film can be formed on an insulating substrate, an spitaxial ferroelectric thin film can be formed on that thin film electrode. Accordingly, the present invention makes it possible to prepare a device having a capacitor type electrode structure that could not be formed on an insulating substrate or an insulating thin film without an epitaxial electrode.

EXAMPLE 11

An epitaxial buffer layer was formed on a GaAs (100) single crystal substrate by excimer laser deposition, in which the surface of a target is instantaneously heated and evaporated by UV laser pulses, under the following conditions.

Excimer laser: XeCl excimer laser having a wavelength of 308 nm

Pulse Frequency: 4 Hz

Pulse Length: 17 ns

Energy: 130 mJ (energy density on the target surface: 1.3 J/cm$^2$)

Metallic magnesium was used as a target to make MaO grow. Prior to the deposition, the GaAs single crystal substrate was washed with a solvent, etched with a sulfuric acid-based solution, rinsed with deionized water and ethanol, and spin-dried with ethanol in a nitrogen stream.

Figure 9:
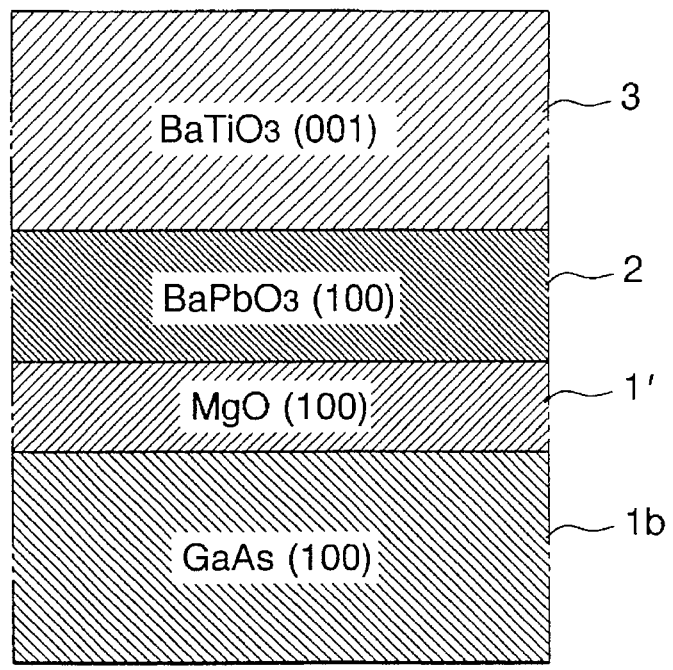
FIG. 9 shows an oriented ferroelectric thin film having a multi-layered structure prepared in Example 11, comprising a GaAs (100) substrate having formed thereon $BaTiO_3$ (001)/$BaPbO_3$ (100)/MgO (100).

The substrate immediately after spin-drying was set in a deposition chamber and heated to 350° C. to deposit an epitaxial MGO (100) buffer layer thereon to a thickness of 400 Å. On the buffer layer were further formed successively a 10000 Å thick BaPbO$_3$ (100) layer and a 2000 Å thick BaTiO$_3$ (001) layer by in situ epitaxial growth at 700° C. The structure of the resulting oriented ferroelectric thin film is shown in FIG. 9. As shown in the Fig., the layer structure comprises semiconductor substrate 1$b$ having formed thereon buffer layer 1', conductive layer 2, and ferroelectric layer 3 in this order.

Examples of combinations of a ferroelectric substance layer, a conductive substance layer, a buffer layer, and a semiconductor single crystal substrate as used here are shown in Table 4.

EXAMPLE 12

Figure 10:
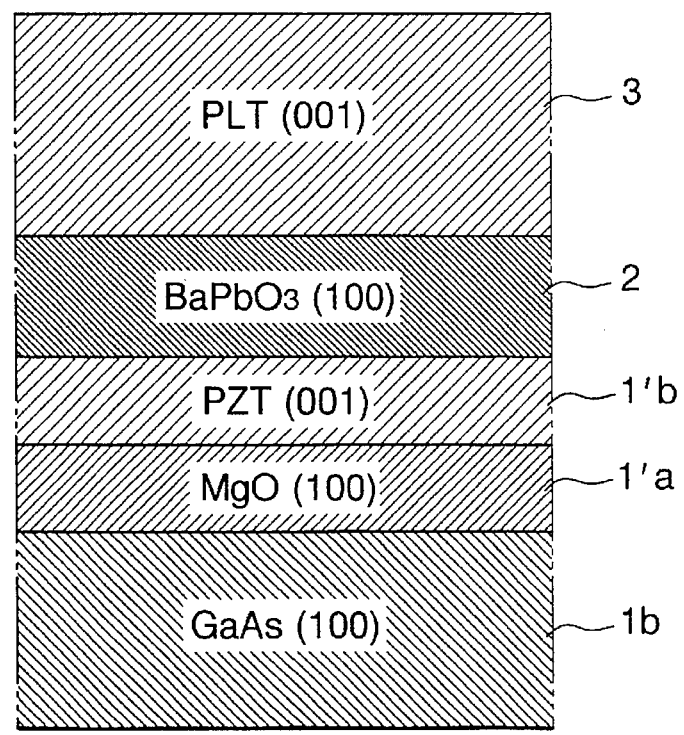
FIG. 10 shows an oriented ferroelectric thin film having a multi-layered structure prepared in Example 12, comprising a GaAs (100) substrate having formed thereon eptitaxial PLT (001)/$BaPbO_3$ (100)/PZT (001)/MgO (100).

An epitaxialaxial MgO buffer layer was formed on a GaAs (100) single crystal substrate by excimer laser deposition in the same manner as in Example 11. Then, a PZT thin film, a BaPbO$_3$ thin film, and a PLT thin film were successively formed thereon using the respective precursor solution in the same manner as in the foregoing Examples to obtain a multi-layered epitaxial structure of PLT (001)/ BaPbO$_3$ (100)/PZT (001)/MgO (100)/GaAs (100) shown in FIG. 10. The oriented ferroelectric thin film shown in FIG. 10 comprises semiconductor substrate 1$b$ having provided thereon first buffer layer 1'$a$, second buffer layer 1'$b$, conductive layer 2, and ferroelectric layer 3 in this order.

Examples of combinations of a ferroelectric substance layer, a conductive substance layer, first and second buffer layers, and a semiconductor single crystal substrate as used here are shown in Table 5.

Figure 11:
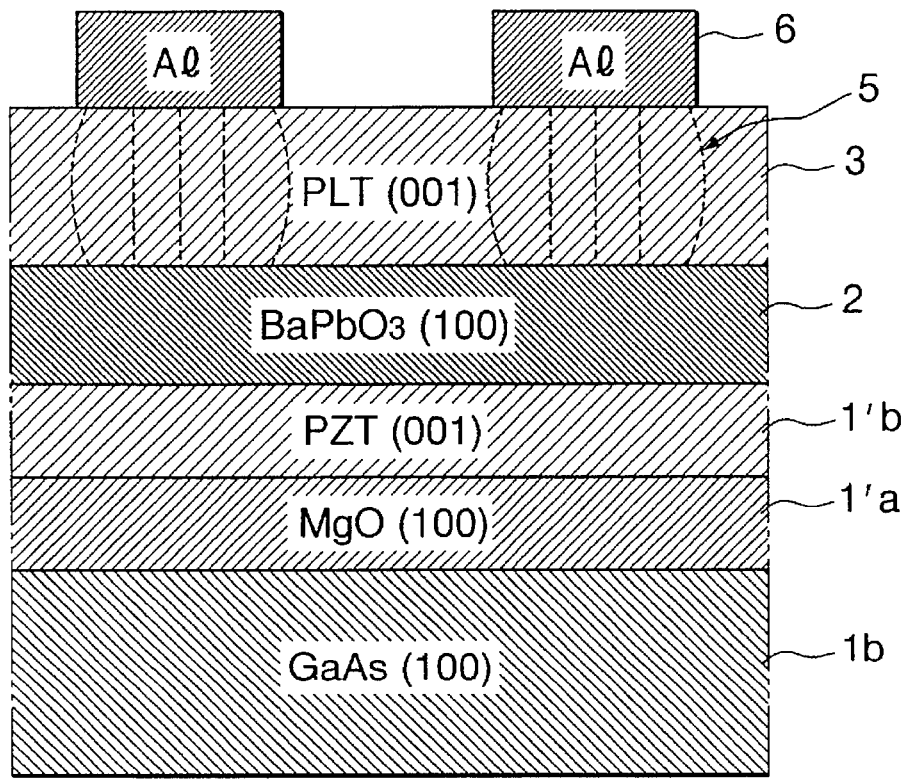
FIG. 11 shows an optical switching device utilizing electro-optic effects, comprising the oriented ferroelectric thin film of Example 12 having an upper electrode on the PLT, thin film thereof.
Figure 12:
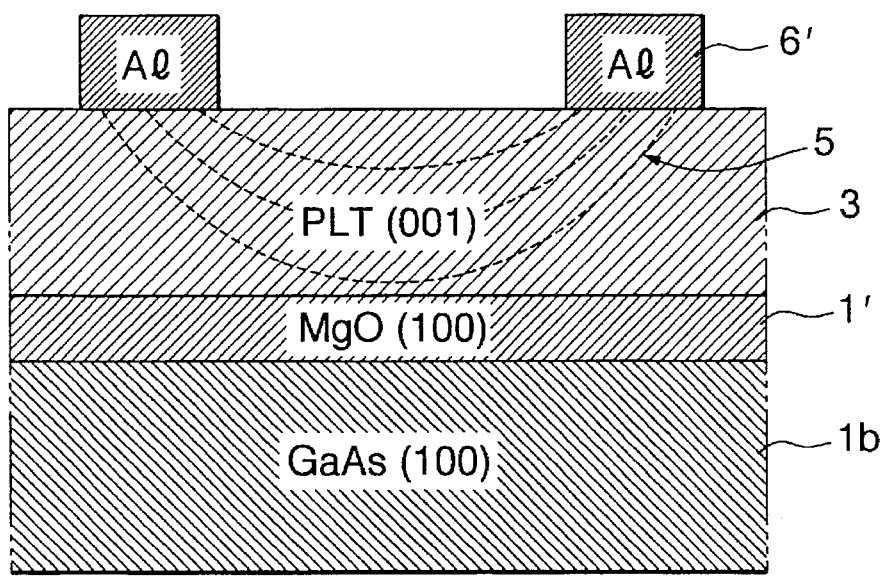
FIG. 12 shows an optical switching device utilizing electro-optic effects, having an electrode on the PLT which is set on a substrate and buffer layer, which has a conventional structure with no conductive layer.

An aluminum electrode having a comb form was then formed on the surface of the PLT thin film as shown in FIG. 11, and laser light was introduced into the PLT thin film waveguide. As shown in the FIG. 11, with voltage applied between upper electrode 6 (Al) and lower electrode 2 (BaPbO$_3$), the introduced laser light could be switched by Bragg reflection due to the electro-optic effects of lines of electric force 5. Therefore, this element is useful as a thin film waveguide as in Example 10. Compared with an element only having opposing comb electrodes 6' on the surface of PLT as shown in FIG. 12, the element of FIG. 11 makes it possible to apply voltage effectively in the thickness direction of PLT. As a result, the driving voltage can be reduced, and an element can be prepared with extreme ease with no restriction in controlling the electrode distance as has been laid in the case of electrode microprocessing.

According to the process of the present invention, an epitaxial or oriented conductive thin film of an inexpensive and oxidation-resistant oxide can be obtained in a reduced time by using a solution of an organometallic compound as an oxide precursor. Use of such a precursor solution is advantageous in terms of precise control of chemical composition, uniformity on a molecular level, low temperature for processing, large area of the resulting thin film, and reduced cost of equipment. Therefore, a conductive oxide thin film suitable as an electrode for nonvolatile memories or light modulation devices can be prepared. Further, the precursor solution is advantageous for coating not only a flat substrate but a substrate having a complicated shape.

The conductive oxides used in the present invention have a lattice constant and a crystal structure close to those of many ferroelectric substances. Therefore, an epitaxial or oriented thin film of a ferroelectric substance can be deposited on the conductive oxide thin film to provide high performance devices.

The oriented conductive thin film having an epitaxial or oriented ferroelectric thin film on the conductive oxide thin film manifests the excellent characteristics possessed by a ferroelectric substance, such as a high residual polarization and a high electro-optic constant.

The epitaxial or oriented conductive oxide thin film formed between a ferroelectric substance layer and a substrate serves as an thin film electrode to provide a switching element of a light modulation device or a high performance nonvolatile memory which can be driven at low voltage.

Formation of an epitaxial or oriented oxide thin film electrode on a semiconductor substrate and formation of an epitaxial or oriented ferroelectric thin film on that film electrode provide a light modulation device on a GaAs type semiconductor laser or an optical integrated circuit on an Si semiconductor integrated circuit.

While the invention has been described in detail and with reference to specific examples thereof, it will be apparent to one skilled in the art that various changes and modifications can be made therein without departing from the spirit and scope thereof.

What is claimed is:

1. A process for preparing a mono-axially oriented conductive thin film comprising coating a single crystal substrate with a metal oxide precursor solution comprising an unhydrolyzed organometallic compound and subjecting the coating layer to thermal decomposition followed by annealing the coated substrate to form an epitaxial or mono-axially oriented perovskite ABO$_3$ structure oxide conductive thin film.

2. A process as claimed in claim 1, wherein said organometallic compound is a mixture of organometallic compounds selected from the group consisting of metal alkoxides and organic acid metal salts, or a reaction product of organometallic compounds selected from the group consisting of metal alkoxides and organic acid metal salts.

3. A process as claimed in claim 1, wherein said single crystal substrate is an oxide single crystal substrate or a semiconductor single crystal substrate.

4. A process as claimed in claim 1, wherein said single crystal substrate has an epitaxial or oriented buffer layer on the surface thereof.

5. A process as claimed in claim 1, wherein said oxide conductive thin film is a film of BaPbO$_3$.

6. A process as claimed in claim 1, wherein said process further comprises forming an epitaxial or oriented thin film of a perovskite ABO$_3$ structure ferroelectric substance on said epitaxial or oriented perovskite ABO$_3$ structure oxide conductive thin film.

7. A process as claimed in claim 1, wherein said thermal decomposition is carried out by heating the coated substrate at a rate of temperature rise of from 0.1 to 500° C./sec and maintaining the coated substrate at a temperature of from 100° to 500° C.

8. A process as claimed in claim 1, wherein said annealing is carried out by heating the coated substrate at a rate of temperature rise of from 0.1° to 500° C./sec and maintaining the coated substrate at a temperature of from 300° to 1200° C.

9. A process as claimed in claim 1, wherein said oriented conductive thin film has a thickness of up to 0.1 micron.

10. A process as claimed in claim 1, wherein said oriented conductive thin film has a thickness of up to 0.35 micron.

11. A process as claimed in claim 1, wherein said oriented conductive thin film has a thickness of up to 1 micron.

12. A process as claimed in claim 1, wherein said process is a non-aqueous process.

13. A process as claimed in claim 1, wherein said organometallic compound is not hydrolyzed prior to said thermal decomposition.

14. A process as claimed in claim 1, wherein said organometallic compound is not hydrolyzed prior to said annealing.

15. A non-aqueous process for preparing a mono-axially oriented conductive thin film comprising coating a single crystal substrate with a metal oxide precursor solution comprising an unhydrolyzed organometallic compound and subjecting the coating layer to thermal decomposition followed by annealing the coated substrate to form an epitaxial or mono-axially oriented perovskite $ABO_3$ structure oxide conductive thin film.

16. A process as claimed in claim 15, wherein said organometallic compound is not hydrolyzed prior to formation of said conductive thin film.

* * * * *